United States Patent
Seo et al.

(10) Patent No.: US 12,396,365 B2
(45) Date of Patent: Aug. 19, 2025

(54) METHOD OF MANUFACTURING FLEXIBLE LARGE-AREA PIEZOELECTRIC COMPOSITE MATERIALS

(71) Applicant: KOREA ELECTRONICS TECHNOLOGY INSTITUTE, Seongnam-si (KR)

(72) Inventors: In Tae Seo, Gwangju-si (KR); Hyung Won Kang, Seoul (KR); Seung Ho Han, Gwacheon-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 737 days.

(21) Appl. No.: 17/739,287

(22) Filed: May 9, 2022

(65) Prior Publication Data

US 2022/0393099 A1   Dec. 8, 2022

(30) Foreign Application Priority Data

Jun. 3, 2021   (KR) .................. 10-2021-0072198

(51) Int. Cl.
  *H10N 30/85*   (2023.01)
  *C08J 3/21*   (2006.01)
  (Continued)

(52) U.S. Cl.
  CPC ............ *H10N 30/092* (2023.02); *C08J 3/212* (2013.01); *C08J 5/121* (2013.01); *C08J 5/18* (2013.01);
  (Continued)

(58) Field of Classification Search
  CPC .... B29C 41/28; H10N 30/092; H10N 30/852; H10N 30/088; H10N 30/853
  See application file for complete search history.

(56) References Cited

U.S. PATENT DOCUMENTS 2,966,719 A * 1/1961 Park, Jr. ................ C04B 35/634
                                                264/650
6,093,338 A * 7/2000 Tani ...................... C04B 35/462
                                                501/12

FOREIGN PATENT DOCUMENTS

KR   10-1442632 B1   9/2014
KR   10-2042638 B1   11/2019

OTHER PUBLICATIONS

Mistler, R. E., and E. R. Twiname. Tape Casting: Theory and Practice. Wiley, 2000 (Year: 2000).*

* cited by examiner

*Primary Examiner* — Livius R. Cazan
(74) *Attorney, Agent, or Firm* — NSIP Law

(57) ABSTRACT

Proposed is a method of manufacturing a piezoelectric composite material. The method includes the steps: wet mixing the ceramic powder, the polymer binder, the plasticizer, and the solvent for 4 to 72 hours to produce the mixed slurry, in which the amount of the polymer binder in the mixed slurry is 3 to 10 parts by weight, the amount of the plasticizer is 0.1 to 3 parts by weight, and the amount of the solvent is 30 or more to less than 50 parts by weight, based on 100 parts by weight of the ceramic powder in the mixed slurry; introducing the mixed slurry into a tape casting process to produce a piezoelectric composite sheet; drying and molding the piezoelectric composite sheet in a roll-to-roll process to form a molded piezoelectric composite sheet; laminating and compressing piezoelectric composite sheets molded to produce piezoelectric composite sheet laminates; and cutting the piezoelectric composite sheet laminate into the desired shape and size.

13 Claims, 3 Drawing Sheets

(51) Int. Cl.
*C08J 5/12* (2006.01)
*C08J 5/18* (2006.01)
*C08K 3/22* (2006.01)
*C08K 5/12* (2006.01)
*H10N 30/088* (2023.01)
*H10N 30/092* (2023.01)
*H10N 30/853* (2023.01)
*H10N 30/857* (2023.01)

(52) U.S. Cl.
CPC ............... *C08K 3/22* (2013.01); *C08K 5/12* (2013.01); *H10N 30/088* (2023.02); *H10N 30/852* (2023.02); *H10N 30/853* (2023.02); *H10N 30/857* (2023.02); *C08J 2329/14* (2013.01); *C08K 2003/2244* (2013.01); *C08K 2201/001* (2013.01); *C08K 2201/005* (2013.01)

METHOD OF MANUFACTURING FLEXIBLE LARGE-AREA PIEZOELECTRIC COMPOSITE MATERIALS

CROSS REFERENCE TO RELATED APPLICATION

The present application claims priority to Korean Patent Application No. 10-2021-0072198, filed Jun. 3, 2021, the entire contents of which is incorporated herein for all purposes by this reference.

BACKGROUND OF THE INVENTION

1. Field of the Invention

The present disclosure relates to a method of manufacturing a flexible large-area piezoelectric composite material. More specifically, the present disclosure relates to a method of shaping a mixed slurry having a specific composition into a flexible, large-area piezoelectric composite sheet through tape casting and of manufacturing a piezoelectric composite material therefrom.

2. Description of the Related Art

Piezoelectric ceramics are materials enabling reversible conversion between mechanical energy and electrical energy and are used in various devices such as haptic actuators, ultrasonic sensors, and energy harvesters. In particular, unlike other new and renewable energy, the piezoelectric energy harvester uses vibration as an energy source and thus has an advantage that it can be easily used in various places. Recently, by maximizing these advantages, it is attracting attention as a bio-junction element that supplies power to a wearable device by using the vibration of the human body.

In order to be applied to the piezoelectric energy harvester, flexibility is necessarily provided to the piezoelectric ceramic, and in order to provide flexibility to a piezoelectric device, a composite in which a polymer has excellent flexibility and the piezoelectric ceramic are mixed is generally used. In this regard, as disclosed in Korea Patent Publication Nos. 10-2042638 and 10-1442632, polydimethylsiloxane (PDMS) and polyvinylidene fluoride (PVDF), having flexibility and higher piezoelectric characteristics than other polymers, have been mainly used as a polymer included in the composite.

More recently, there have been further attempts to mass-produce devices such as the piezoelectric harvester, and thus there is a demand for a method of mass-producing a larger-area piezoelectric composite material. In order to produce the material in the form of a sheet as described above in a large-area, a roll-to-roll process based on tape casting is mainly used. However, in the case of PDMS, the glass transition temperature is low, and the viscosity is not sufficient to produce the sheet by tape casting. In the case of PVDF, it is not economically efficient due to its high unit cost, and it is not easy to apply PVDF to a sheet mass production process by tape casting due to the toxicity of fluorine components contained in PVDF.

SUMMARY OF THE DISCLOSURE

Accordingly, an objective of the present disclosure is to provide a method for manufacturing a large-area piezoelectric composite material through a tape casting process by using a slurry including components such as polyvinyl butyral (PVB), and piezoelectric ceramic and plasticizer that can be introduced into the tape casting process is used while maintaining the piezoelectric properties at the PDMS and PVDF levels.

According to one aspect of the present disclosure, provided is a method of manufacturing a piezoelectric composite material, the method may include the steps: wet mixing the ceramic powder, the polymer binder, the plasticizer, and the solvent for 4 to 72 hours to produce the mixed slurry, in which the amount of the polymer binder in the mixed slurry is 3 to 10 parts by weight, the amount of the plasticizer is 0.1 to 3 parts by weight, and the amount of the solvent is 30 or more to less than 50 parts by weight, based on 100 parts by weight of the ceramic powder in the mixed slurry; introducing the mixed slurry into a tape casting process to produce a piezoelectric composite sheet; drying and molding the piezoelectric composite sheet in a roll-to-roll process to form a molded piezoelectric composite sheet; laminating and compressing the piezoelectric composite sheet to produce piezoelectric composite sheet laminates; and cutting the piezoelectric composite sheet laminate into the desired shape and size.

According to an embodiment of the present disclosure, the ceramic powder may be selected from the group consisting of lead zirconate titanate (PZT), lead magnesium niobate (PMN), lead manganese niobate (PMN), lead zinc niobate (PZN), lead nickel niobate (PNN), lead antimony niobate (PSN), lead copper niobate (PCN), lead zinc nickel niobate (PZNN), potassium sodium niobate (KNN), barium titanate (BT), sodium bismuth titanate (NBT), and combinations thereof.

According to one embodiment of the present disclosure, the particle size of the ceramic powder may be 0.1 μm or more.

According to an embodiment of the present disclosure, the polymer binder may be polyvinyl butyral (PVB).

According to one embodiment of the present disclosure, the plasticizer may be selected from the group consisting of dibutyl phthalate (DBP), diethylhexyl phthalate (DEHP), butylbenzyl phthalate (BBP), diisononyl phthalate (DINP), diisodecyl phthalate (DIDP), and combinations thereof.

According to one embodiment of the present disclosure, the solvent may be selected from the group consisting of methanol, ethanol, benzene, toluene, xylene, and combinations thereof.

According to one embodiment of the present disclosure, the content of the polymer binder in the mixed slurry may be less than 5 parts by weight based on 100 parts by weight of the ceramic powder in the mixed slurry.

According to one embodiment of the present disclosure, the content of the plasticizer in the mixed slurry may be less than 1 part by weight based on 100 parts by weight of the ceramic powder in the mixed slurry.

According to one embodiment of the present disclosure, the content of the solvent in the mixed slurry may be 45 parts by weight or less based on 100 parts by weight of the ceramic powder in the mixed slurry.

According to an embodiment of the present disclosure, the wet mixing may further include a stirring and a milling, in which the stirring includes a first stirring at 1200 to 1400 rpm for 1 to 3 hours and a second stirring at 450 to 550 rpm for 10 to 15 hours, and the stirring is a step of producing a mixture in which the polymer binder, plasticizer, and solvent are mixed. The milling is generating the mixed slurry by grinding the ceramic powder and mixing the same with the mixture in which the milling may include a first milling at 1200 to 1800 rpm for 10 minutes to 1 hour and a second milling at 1800 to 2500 rpm for 1 hour to 2 hours.

According to one embodiment of the present disclosure, the tape casting speed may be 0.5 m/min to 3 m/min.

According to one embodiment of the present disclosure, the drying may be performed at 40 to 150° C.

According to one embodiment of the present disclosure, the drying may have a temperature gradient of three steps, in which the temperature of the first drying step≤the temperature of the second drying step≤the temperature of the third drying step.

When PDMS and PVDF are used as the polymer, a piezoelectric composite material that may be produced only at a laboratory scale may be prepared in a large-area piezoelectric composite material through the preparation method according to the present disclosure. In addition, in the method for manufacturing a piezoelectric composite material according to the present disclosure, the piezoelectric composite sheet may be directly applied to a roll-to-roll process, and since PVB, which is cheaper than conventional PDMS and PVDF, is used as a polymer binder, mass production is easy and economic advantages. In addition, the piezoelectric composite material prepared by the above method has excellent corrosion resistance to a basic solution and thus is easily applied to an electroless plating process having excellent mass production properties in the process of applying a conductive electrode pattern to the piezoelectric composite material after manufacturing the piezoelectric composite material.

DESCRIPTION OF THE PREFERRED EMBODIMENTS

Figure 1:
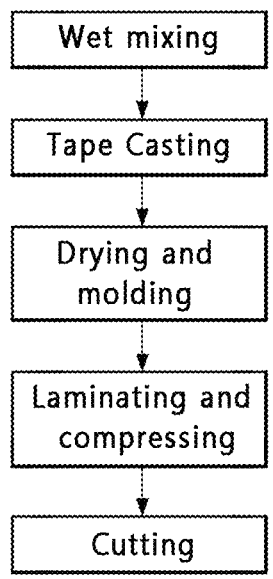
FIG. 1 is a schematic process flow diagram of a method for manufacturing a piezoelectric composite material according to the present disclosure.

According to one aspect of the present disclosure, a method of manufacturing a piezoelectric composite material is provided. Here, the piezoelectric composite material is a final product manufactured through a series of processes to be described later and essentially includes a polymer binder as well as a piezoelectric ceramic as a component of the final product.

The method may include wet mixing the ceramic powder, polymer binder, plasticizer, and solvent for 4 to 72 hours to produce a mixed slurry. The wet mixing time may be 4 to 60 hours, 4 to 50 hours, 4 to 40 hours, 4 to 30 hours, 6 to 60 hours, 6 to 50 hours, 6 to 40 hours, 6 to 30 hours, 8 to 60 hours, 8 to 50 hours, 8 to 40 hours, 8 to 30 hours, 10 to 60 hours, 10 to 50 hours, 10 to 40 hours, 10 to 30 hours, 20 to 60 hours, 20 to 50 hours, 20 to 40 hours, and 20 to 30 hours. When the wet mixing time is less than 4 hours, mixing between the components of the mixed slurry is not made uniformly, so the uniformity of the quality of the final product may not be guaranteed. When the wet mixing time exceeds 72 hours, the ceramic powder is excessively ground by the milling process during the mixing step, such that the particle size of the ceramic powder may be less than 0.1 μm, and the ceramic powder having a particle size less than 0.1 μm has no piezoelectric characteristics.

The ceramic powder may be a ceramic powder having piezoelectric properties. The ceramic powder includes lead zirconate titanate (PZT), lead magnesium niobate (PMN), lead manganese niobate (PMN), lead zinc niobate (PZN), lead nickel niobate (PNN), lead antimony niobate (PSN), lead copper niobate (PCN), lead zinc nickel niobate (PZNN), and a combination thereof, but is not limited thereto, and any ceramic powder having piezoelectric properties may be used without limitation. In particular, a piezoelectric ceramic powder including Pb-free potassium sodium niobate (Pb-free KNN), barium titanate (BT), sodium bismuth titanate (NBT), and a combination thereof may also be used.

The polymer binder may be polyvinyl butyral (PVB). When the piezoelectric ceramic powder (pneumatic constant, d33(pC/N)) is 100, even though the typical piezoelectric characteristics of the polymer are very small at a level of 1 to 2, it has been used at a loss of piezoelectric characteristics to give flexibility to the piezoelectric composite material, which is not suitable for the sheet mass production process by tape casting due to the low glass transition temperature, high unit cost, and toxicity as described above. In contrast, PVB has similar piezoelectric characteristics as compared with a conventional polymer but has a glass transition temperature suitable for tape casting, excellent corrosion resistance, and heat resistance, thereby introducing a mixed slurry including the same into tape casting.

The plasticizer may be at least one of dibutyl phthalate (DBP), diethylhexyl phthalate (DEHP), butylbenzyl phthalate (BBP), diisononyl phthalate (DINP), and diisodecyl phthalate (DIDP), but is not limited thereto, and any material capable of imparting plasticity suitable for tape casting to the mixed slurry may be used without limitation.

The solvent is used in the wet mixing for producing the mixed slurry to achieve uniform mixing of the constituents of the mixed slurry. The solvent may be a polar solvent such as methanol or ethanol, a non-polar solvent such as benzene, toluene, xylene, or a combination thereof, but is not limited thereto and may be used without limitation as long as it may achieve uniform mixing of components of the mixed slurry. However, since the solvent should be volatilized in all subsequent drying steps and should not be included in the piezoelectric composite material, which is the final product, the solvent should be a material having a boiling point between 40° C. and 150° C., which is a drying temperature.

When the amount of the ceramic powder in the mixed slurry is 100 parts by weight, the polymer binder in the mixed slurry may be 3 to 10 parts by weight, the content of the plasticizer may be 0.1 to 3 parts by weight, and the content of the solvent may be 30 or more to less than 50 parts by weight.

More specifically, when the content of the ceramic powder in the mixed slurry is 100 parts by weight, the polymer binder in the mixed slurry may be 3 to 10 parts by weight, preferably 4 to 8 parts by weight, more preferably 4 to 7 parts by weight, and most preferably 5 to 6 parts by weight. In particular, it is desirable when the content of the polymer binder is less than 5 parts by weight because flexibility can be imparted to the piezoelectric composite material while maintaining the piezoelectric characteristics of the final product. When the content of the polymer binder is less than 3 parts by weight, it is not easy to achieve the desired degree of flexibility of the piezoelectric composite material as a final product, and when the content of the polymer binder is more than 10 parts by weight, it is not easy to achieve the desired degree of piezoelectric properties because the content of the piezoelectric ceramic powder in the final product is reduced.

When the content of the ceramic powder in the mixed slurry is 100 parts by weight, the content of the plasticizer in the mixed slurry may be 0.1 to 3 parts by weight, preferably 0.1 to 2 parts by weight, more preferably 0.1 to 1.5 parts by weight. In view of providing suitability for a tape casting process while maintaining the strength of the piezoelectric composite material, the piezoelectric composite material may be most preferably less than 0.1 parts by weight to less than 1 part by weight. When the content of the plasticizer is less than 0.1 parts by weight, the plasticity of the mixed slurry is low, so it is not easy to introduce the mixed slurry into tape casting. When the content of the plasticizer is more than 3 parts by weight, the strength of the piezoelectric composite sheet generated by tape casting of the mixed slurry may be decreased.

When the amount of the ceramic powder in the mixed slurry is 100 parts by weight, the solvent in the mixed slurry may be 30 to 50 parts by weight, more preferably 40 to 50 parts by weight, and most preferably less than 40 to 45 parts by weight. When the content of the solvent is less than 30 parts by weight, the ceramic powder, the polymer binder, and the plasticizer are not smoothly mixed in a wet mixing process, and when the content is more than 50 parts by weight, the casting process may not be performed due to excessive drop in slurry viscosity.

In the one embodiment of the present disclosure, when the content of the ceramic powder in the mixed slurry is 100 parts by volume, the polymer binder in the mixed slurry may be 5 to 30 parts by volume, preferably 10 to 25 parts by volume, more preferably 12 to 20 parts by volume, and most preferably 15 to 18 parts by volume. When the content of the solvent in the mixed slurry is 100 parts by volume when the content of the polymer binder in the mixed slurry is less than 5 parts by volume, the viscosity of the mixed slurry is low and not suitable for tape casting, and when the content of the polymer binder is more than 30 parts by volume, the viscosity of the slurry becomes excessively high, so that uniform mixing of each component in the mixed slurry is not achieved, and thus the quality homogeneity of the sheet to be manufactured cannot be guaranteed.

The wet mixing may include a stirring and milling.

The stirring is a step of stirring the polymer binder, plasticizer, and a solvent at a predetermined rotation speed in a stirrer to uniformly distribute the polymer binder and the plasticizer in the solvent, and the stirring step may be performed in two steps of changing a rotation speed. The first step of stirring may be performed for 1 to 3 hours at a rotation speed of 1200 to 1400 rpm, and the second step of stirring may be performed for 10 to 15 hours at a rotation speed of 450 to 550 rpm. Through the stirring in the two steps, the polymer binder and the plasticizer may be uniformly dispersed in the solvent.

The milling is a process for adding the ceramic powder to the mixture of polymer binder, plasticizer, and solvent produced by the stirring step, pulverizing the ceramic powder to the desired particle size, and obtaining a uniformly dispersed mixed slurry. Preferably, it is performed by a basket mill but is not limited thereto, and any apparatus suitable for wet milling may be used without limitation. The milling step may also be performed in two steps of varying the rotation speed, in which the first step of the milling may be performed at a rotation speed of 1200 to 1800 rpm for 10 minutes to 1 hour, and the second step of the milling may be performed at a rotation speed of 1800 to 2500 rpm for 1 hour to 2 hours. The ceramic powder may also be pulverized to even particle size through the milling in the second step to be uniformly dispersed in a mixture of a polymer binder, a plasticizer, and a solvent.

In one embodiment, the stirring and milling may be performed in the order of stirring and then milling. As described above, the piezoelectric properties of the ceramic powder of the present disclosure are remarkably reduced at a size of less than 1 μm. When the ceramic powder is first milled to a desired particle size and then stirred with a polymer binder, a plasticizer, and a solvent, the ceramic powder may be additionally pulverized in the stirring step, and in order to prevent additional pulverization, the polymer binder, the plasticizer, and the solvent are first stirred, and then the ceramic powder is milled to be mixed.

Figure 2:
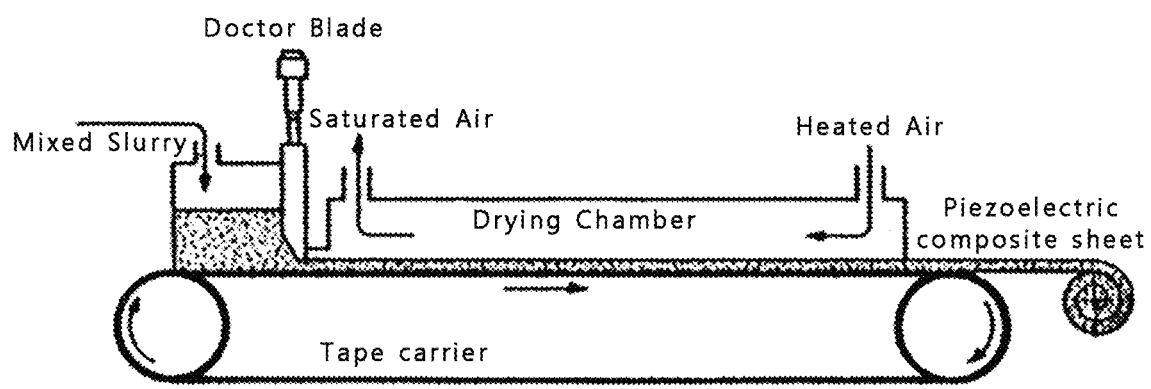
FIG. 2 is a schematic diagram of an apparatus used in a tape casting step according to the present disclosure.

The method may include subjecting the mixed slurry to a tape casting process to produce a piezoelectric composite sheet. In one embodiment, the piezoelectric composite sheet may be a sheet having an area of about 200 mm in width×5 m in length. The tape casting may be performed by an apparatus as shown in FIG. 2, and specifically, a tape casting is performed by introducing the mixed slurry and treating the mixed slurry with heated inlet air through a tape carrier while controlling the thickness of the sheet generated by controlling the height of the doctor blade, thereby producing a tape-shaped sheet.

Here, the speed at which the tape carrier proceeds (tape casting speed) may be 0.5 m/min to 3 m/min, preferably 1 m/min to 2.5 m/min, more preferably 1 m/min to 2 m/min, most preferably 1 m/min to 1.5 m/min. When the tape casting speed is less than 0.5 m/min, the minimum shear stress required for sheet production is not supplied, so irregularities may be formed on the surface of the produced piezoelectric composite sheet, so that the surface quality may not be homogeneous, and when the tape casting speed exceeds 3 m/min, there is a possibility that the sheet is cut due to excessive shear stress applied to the piezoelectric composite sheet.

The piezoelectric composite sheet produced by the tape casting method may be dried and molded at the same time as casting or after a roll-to-roll process.

The roll-to-roll process is a process of applying a piezoelectric composite sheet on a flexible film such as a PVC film through a roller, drying, and molding a piezoelectric composite sheet. As described above, the piezoelectric composite sheet of the present disclosure includes a polymer binder such as PVB and thus has flexibility and thus may be introduced into a roll-to-roll process. The roll-to-roll equipment can be designed on a larger scale as well as on a laboratory scale, so it is suitable for manufacturing a large-area piezoelectric composite material for the objective of the present disclosure.

The drying may be performed at a temperature of 40 to 150° C., and, as described above, by the drying step, all solvents having a boiling point within the temperature range are volatilized.

More specifically, the drying may be performed over three temperature gradients steps. The temperature gradient of the drying of the three steps may be the temperature of the first step≤the temperature of the second step≤the temperature of the third step. The first step of drying may be performed at 40 to 80° C., the second step of drying may be performed at 60 to 120° C., and the third step of drying may be performed at 100 to 150° C. Through the three steps of drying as described above, it is possible to prevent damage to the piezoelectric composite sheet due to a rapid temperature rise and prevent the sheet from lifting during the tape casting process.

The molding may be performed in such a way that the pattern is formed on the piezoelectric composite sheet by applying the pattern to the rollers used in the roll-to-roll process and allowing the piezoelectric composite sheet to pass between the rollers.

The method may not include a subsequent burnout step. In a conventional manufacturing process of a piezoelectric material, after producing a piezoelectric composite sheet, it is introduced at a high temperature of several hundred ° C. or more than 1000° C. to volatilize the polymer binder and residual solvent that may be present in the sheet. In contrast, in the method of the present disclosure, the piezoelectric composite material, which is a final product, may contain a polymer binder by not including the burnout step, thereby reaching a piezoelectric composite material having a target large-area and flexibility suitable for a wearable device.

The method may include laminating and compressing the molded piezoelectric composite sheet to form a piezoelectric composite sheet laminate and cutting the piezoelectric composite sheet laminate into a desired shape and size. The laminating and compressing is a step for laminating several to hundreds of piezoelectric composite sheets and then compressing them to produce a laminate of the desired thickness, depending on the intended use, the piezoelectric composite material is finally obtained by cutting the piezoelectric composite sheet laminate generated here into a desired shape and size.

The piezoelectric composite material produced by the above method may have a tensile strength of 5 MPa or more, preferably 6 MPa or more, more preferably 7 MPa or more. In addition, the piezoelectric composite material may exhibit an elongation of 15% or more, preferably 18% or more, more preferably 20% or more, and most preferably 23% or more. By exhibiting the tensile strength and elongation as described above, the piezoelectric composite material may have flexibility suitable for use in wearable devices.

Hereinafter, preferred examples are presented to help the understanding of the present disclosure, but the following examples are provided for easier understanding of the present disclosure, and the present disclosure is not limited thereto.

PRODUCTION EXAMPLE

A commercial PZT-based ceramic powder and a PVB-based commercial polymer binder solution containing a plasticizer and ethanol solvent was weighed in a weight ratio of 60:40 and then wet-mixed with zirconia balls in a nylon jar for 12 hours. The mixed slurry produced by wet mixing was molded into a piezoelectric composite sheet having a thickness of 30 min to 33 min on a Si-coated PVC film using a tape casting equipment. As molding proceeded, the sheet was dried at about 80° C., and all of the remaining ethanol solvents were volatilized.

Figure 3:
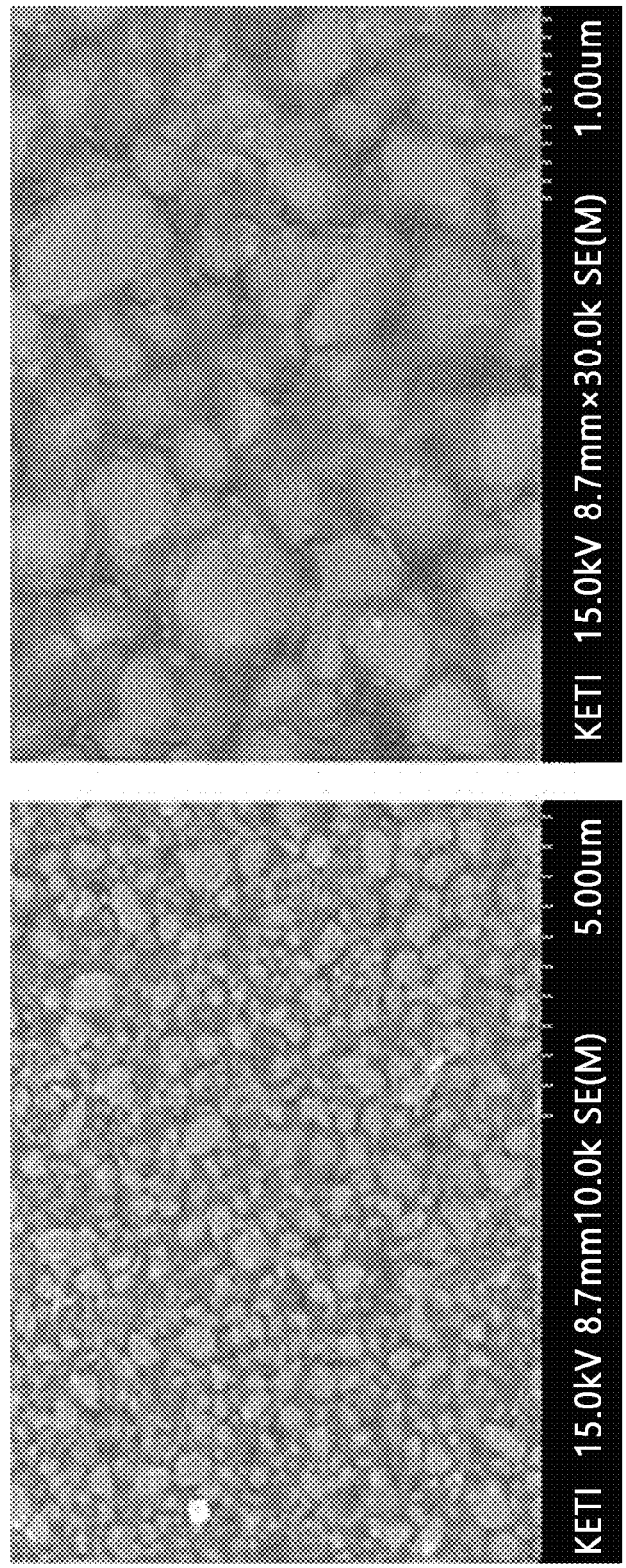
FIG. 3 is a scanning electron microscope (SEM) image of the microstructure of the piezoelectric composite sheet manufactured by Preparation Example according to the present disclosure.

The internal microstructure of the piezoelectric composite sheet is shown in FIG. 3. Referring to FIG. 3, the microstructure of the piezoelectric composite sheet is a shape in which PZT-based ceramic powder is evenly distributed in a PVB-based polymer matrix, and it was confined that a typical 0-3 piezoelectric composite material (ceramic polymer composite) is formed.

COMPARATIVE PREPARATION EXAMPLE

In the Preparation Example, a piezoelectric composite sheet was prepared in the same manner as in the Preparation Example, except that the weight ratio of the commercial PZT-based ceramic powder and the PVB-based commercial polymer binder solution was 30:70.

Example—Measurement of Tensile Strength and Elongation of Piezoelectric Composite Materials Each of the piezoelectric composite sheets having a thickness of 31 µm, 32 µm, and 33 µm, prepared, according to the above Preparation Example, were laminated 40 sheets each after removing the PVC film and then compressed at 65° C. to obtain three piezoelectric composite materials (Samples 1 to 3), all of them were cut to a uniform size of 1 mm×1 mm. Tensile stress was applied to the prepared samples 1 to 3 using a tensile compression tester, and tensile strength, which is the tensile stress at the time of failure, and elongation indicating the degree of maximum elongation before failure was measured, and the results are shown in Table 1 below.

TABLE 1

| Sample Num. | Thickness (µm) | Tensile stress (Mpa) | Elongation (%) |
| --- | --- | --- | --- |
| 1 | 31 | 8.18 | 23.70 |
| 2 | 32 | 7.92 | 23.97 |
| 3 | 33 | 8.23 | 24.46 |

As shown in Table 1, samples 1 to 3 all had an excellent tensile strength of about 8 MPa, and elongation was also very high at about 24%, so it was observed that they had a degree of flexibility applicable to wearable devices.

As described above, in order to measure the piezoelectric properties of the piezoelectric composite material according to the Preparation Example of the present disclosure having the flexibility applicable to the wearable device, the following additional experiment was performed.

Example—Measurement of Piezoelectric Properties of Piezoelectric Composite Materials 40 sheets of piezoelectric composite sheets having a thickness of 31 m, prepared by Sample 1 and Comparative Preparation Example, were laminated and pressed at 65° C., and then cut to a size of 1 mm×1 mm, an Ag electrode was applied on both sides of Sample 1 of Comparative Example and then dried. For Sample 1 and Comparative Example Sample 1 to which the Ag electrode was applied as described above, an electric field of 4 kV/mm was applied in Si oil at 100° C. for 1 hour to confirm the piezoelectric properties represented by d33 after polarization treatment. The hysteresis curve, according to the measurement, is as shown in FIG. 4.

Figure 4:
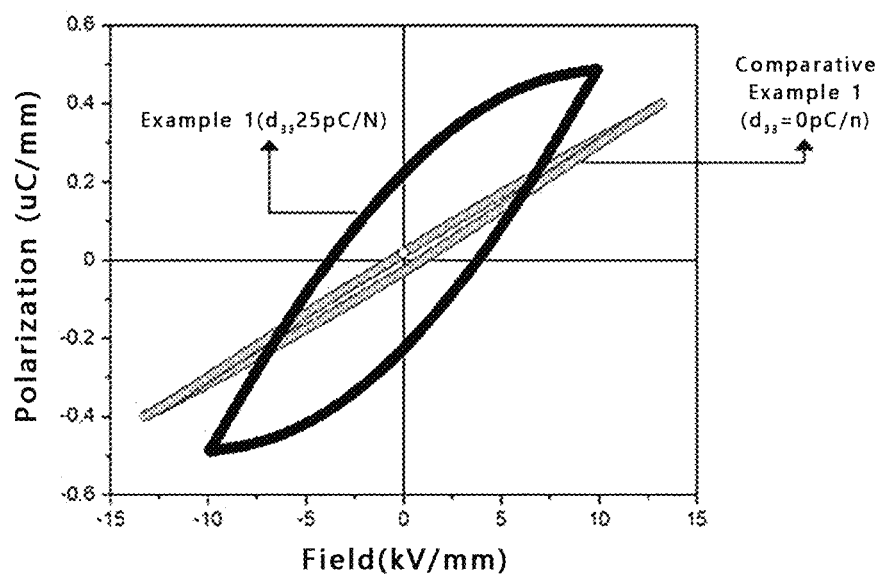
FIG. 4 is a hysteresis curve of polarization with respect to an electric field of the piezoelectric composite material of Examples and Comparative Examples measured according to an embodiment of the present disclosure.

Referring to FIG. 4, when the applied electric field returns to zero again after applying the electric field, in the case of Sample 1, a polarization of about 0.2 pC/mm is exhibited. It was observed that the ferroelectric properties were superior to Comparative Example Sample 1, which exhibited a polarization close to zero under the same conditions.

That is, the piezoelectric composite material manufactured by the Preparation Example of the present disclosure can be produced in a large-area by the tape casting process and exhibits excellent piezoelectric properties while having flexibility, so that it is suitable for the power supply of wearable devices and application as a bio-junction device.

What is claimed is:

1. A method of manufacturing a piezoelectric composite material, the method comprising:
    wet mixing a ceramic powder, a polymer binder, a plasticizer, and a solvent for 4 to 72 hours to produce a mixed slurry, wherein the amount of the polymer binder in the mixed slurry is 3 to 10 parts by weight, the amount of the plasticizer is 0.1 to 3 parts by weight, and the amount of the solvent is 30 or more to less than 50 parts by weight, based on 100 parts by weight of the ceramic powder in the mixed slurry;
    introducing the mixed slurry into a tape casting process to produce a piezoelectric composite sheet;
    drying and molding the piezoelectric composite sheet through a roll-to-roll process to produce a molded piezoelectric composite sheet;
    laminating and compressing the molded piezoelectric composite sheet to produce a piezoelectric composite sheet laminate; and
    cutting the piezoelectric composite sheet laminate into a part having the desired shape and size,
    wherein the wet mixing further comprises a stirring and milling, wherein the stirring is a step of producing a mixture in which the polymer binder, the plasticizer, and the solvent are mixed, and the milling is a step of pulverizing the ceramic powder and mixing it with the mixture to produce the mixed slurry, wherein the stirring comprises a first stirring step for 1 to 3 hours at 1200 to 1400 rpm and a second stirring step for 10 to 15 hours at 450 to 550 rpm, and the milling comprises a first milling step for 10 minutes to 1 hour at 1200 to 1800 rpm and a second milling step for 1 hour to 2 hours at 1800 to 2500 rpm.

2. A method of manufacturing a piezoelectric composite material, the method comprising:
    wet mixing a ceramic powder, a polymer binder, a plasticizer, and a solvent for 4 to 72 hours to produce a mixed slurry, wherein the amount of the polymer binder in the mixed slurry is 3 to 10 parts by weight, the amount of the plasticizer is 0.1 to 3 parts by weight, and the amount of the solvent is 30 or more to less than 50 parts by weight, based on 100 parts by weight of the ceramic powder in the mixed slurry;
    introducing the mixed slurry into a tape casting process to produce a piezoelectric composite sheet;
    drying and molding the piezoelectric composite sheet through a roll-to-roll process to produce a molded piezoelectric composite sheet;
    laminating and compressing the molded piezoelectric composite sheet to produce a piezoelectric composite sheet laminate; and
    cutting the piezoelectric composite sheet laminate into a part having the desired shape and size,
    wherein the ceramic powder is selected from the group consisting of lead zirconate titanate (PZT), lead magnesium niobate (PMN), lead manganese niobate (PMN), lead zinc niobate (PZN), lead nickel niobate (PNN), lead antimony niobate (PSN), lead copper niobate (PCN), lead zinc nickel niobate (PZNN), Pb-free potassium sodium niobate (KNN), barium titanate (BT), sodium bismuth titanate (NBT), and combinations thereof.

3. The method of claim 2, wherein the ceramic powder has a particle size of 0.1 µm or more.

4. The method of claim 2, wherein the polymer binder is PVB (polyvinyl butyral).

5. The method of claim 2, wherein the plasticizer is selected from the group consisting of dibutyl phthalate (DBP), diethylhexyl phthalate (DEHP), butylbenzyl phthalate (BBP), diisononyl phthalate (DINP), diisodecyl phthalate (DIDP), and combinations thereof.

6. The method of claim 2, wherein the solvent is selected from the group consisting of methanol, ethanol, benzene, toluene, xylene, and combinations thereof.

7. The method of claim 2, wherein the amount of the polymer binder in the mixed slurry is less than 5 parts by weight based on 100 parts by weight of the ceramic powder in the mixed slurry.

8. The method of claim 2, wherein the amount of the plasticizer in the mixed slurry is less than 1 part by weight based on 100 parts by weight of the ceramic powder in the mixed slurry.

9. The method of claim 2, wherein the amount of the solvent in the mixed slurry is less than 45 parts by weight based on 100 parts by weight of the ceramic powder in the mixed slurry.

10. The method of claim 2, wherein the tape casting speed is 0.5 m/min to 3 m/min.

11. The method of claim 2, wherein the drying is performed at 40° C. to 150° C.

12. The method of claim 2, wherein the drying has a temperature gradient of three steps, wherein the temperature of the first drying step≤the temperature of the second drying step≤the temperature of the third drying step.

13. The method of claim 2, wherein the wet mixing further comprises a stirring and milling, wherein the stirring is a step of producing a mixture in which the polymer binder, the plasticizer, and the solvent are mixed, and the milling is a step of pulverizing the ceramic powder and mixing it with the mixture to produce the mixed slurry, wherein the stirring comprises a first stirring step for 1 to 3 hours at 1200 to 1400 rpm and a second stirring step for 10 to 15 hours at 450 to 550 rpm, and the milling comprises a first milling step for 10 minutes to 1 hour at 1200 to 1800 rpm and a second milling step for 1 hour to 2 hours at 1800 to 2500 rpm.

\* \* \* \* \*